(12) United States Patent
Welch et al.

(10) Patent No.: US 6,603,595 B2
(45) Date of Patent: Aug. 5, 2003

(54) RAMAN-BASED UTILITY OPTICAL AMPLIFIER

(75) Inventors: David F. Welch, Menlo Park, CA (US); Robert J. Lang, Pleasanton, CA (US); Edward C. Vail, Menlo Park, CA (US); Mehrdad Ziari, Pleasanton, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/185,458

(22) Filed: Jun. 26, 2002

(65) Prior Publication Data

US 2002/0163713 A1 Nov. 7, 2002

Related U.S. Application Data

(63) Continuation of application No. 09/664,986, filed on Sep. 18, 2000, now Pat. No. 6,433,920, which is a continuation-in-part of application No. 09/559,936, filed on Apr. 27, 2000, and a continuation-in-part of application No. 09/613,519, filed on Jul. 10, 2000, now Pat. No. 6,404,542.

(51) Int. Cl.⁷ ................................................. H01S 3/00
(52) U.S. Cl. ..................................... 359/334; 359/337.1
(58) Field of Search ........................... 359/334, 337.1

(56) References Cited

U.S. PATENT DOCUMENTS

| | | | |
|---|---|---|---|
| H742 H | 2/1990 | Bobbs et al. | 330/4.3 |
| 4,922,495 A | 5/1990 | Bobbs et al. | 372/3 |
| 5,275,168 A | 1/1994 | Reintjes et al. | 128/665 |
| 5,375,010 A | 12/1994 | Zervas et al. | |
| 5,486,947 A | 1/1996 | Ohishi et al. | |
| 5,506,723 A | 4/1996 | Junginger | |
| 5,596,448 A * | 1/1997 | Onaka et al. | 359/341 |
| 5,623,508 A | 4/1997 | Grubb et al. | |
| 5,673,280 A | 9/1997 | Grubb et al. | |
| 5,905,838 A | 5/1999 | Judy et al. | |
| 5,909,306 A | 6/1999 | Goldberg et al. | |
| 5,933,270 A * | 8/1999 | Toyohara | 359/341 |
| 5,966,480 A | 10/1999 | LeGrange et al. | |
| 6,433,920 B1 * | 8/2002 | Welch et al. | 359/334 |

FOREIGN PATENT DOCUMENTS

| | | |
|---|---|---|
| EP | 0202629 | 11/1986 |
| EP | 0651479 | 5/1995 |
| JP | 60241288 | 11/1985 |
| WO | WO 9828827 | 7/1998 |
| WO | WO 9943107 | 8/1999 |
| WO | WO 9950941 | 10/1999 |

* cited by examiner

*Primary Examiner*—Mark Hellner
(74) *Attorney, Agent, or Firm*—David N. Lathrop, Esq.; Gallagher & Lathrop

(57) ABSTRACT

An optical amplifier with a flattened wideband response is obtained by coupling counter-propagating pumping energy into an optical waveguide to cause Raman amplification in the optical waveguide, and by reflecting an amplified signal received from the optical waveguide into an output waveguide using a reflector having a spectral characteristic that is complementary to the spectral gain characteristic of the Raman amplification.

15 Claims, 3 Drawing Sheets

RAMAN-BASED UTILITY OPTICAL AMPLIFIER

CROSS-REFERENCE TO RELATED APPLICATIONS

This application is a continuation of U.S. patent application Ser. No. 09/664,986 filed Sep. 18, 2000, now U.S. Pat. No. 6,433,920, which is a continuation-in-part of U.S. patent application Ser. No. 09/559,936 filed Apr. 27, 2000, and U.S. patent application Ser. No. 09/613,519 filed Jul. 10, 2000, now U.S. Pat. No. 6,404,542.

TECHNICAL FIELD

The present invention pertains generally to optical communication devices and pertains more particularly to optical waveguides that provide Raman amplification.

BACKGROUND ART

Current telecommunication and computer network services demand high-capacity communication systems. This demand is often satisfied by optical communication systems in which voice and data signals, represented by optical signals, are conveyed through optical waveguides such as silica fibers. Many optical communication systems are able to achieve better performance by using one or more types of optical amplifiers to increase the intensity of the optical signals. Typically, these optical amplifiers are driven by a source of optical energy known as pumping energy.

The demand for communication system bandwidth is growing rapidly. One technique known as wavelength division multiplexing (WDM) is often used in optical communication systems to meet this growing demand in a cost-effective manner by more fully utilizing the capacity of existing communication facilities. In many practical communication systems, however, the increase in capacity achieved by WDM is restricted by the fact many optical amplifiers can provide gain within only a fairly narrow bandwidth.

The erbium-doped fiber amplifier (EDFA) is one common type of optical amplifier that exhibits this limitation. An EDFA can provide reasonable gain for optical signals having a wavelength of about 1.5 $\mu$m but it cannot provide a useful amount of gain for optical signals having a wavelength of about 1.3 $\mu$m. As a result, the 1.3 $\mu$m portion of the bandwidth is generally underutilized in optical communication systems that incorporate EDFA. This is particularly unfortunate in systems that use silica fiber because signal losses in such fiber are usually lower for wavelengths at 1.3 $\mu$M than they are for wavelengths at 1.5 $\mu$m.

This limitation in bandwidth can be avoided by-using a so called Raman amplifier that achieves amplification through a phenomenon known as Raman scattering. Like EDFA, a Raman amplifier requires a source of pumping energy; however, the level of pumping energy must be considerably higher to achieve reasonable gain. Unlike EDFA, no special doping is required for a Raman amplifier. This feature is particularly attractive because a Raman amplifier can be incorporated into existing optical fibers by merely providing a suitable source of pumping energy. Furthermore, unlike the amplification provided by an EDFA, Raman amplification occurs over a fairly wide bandwidth that is to a large extent dependent upon only the wavelength of the pumping energy.

Unfortunately, a Raman amplifier can be noisier than many other types of optical amplifiers like an EDFA, for example. One source of noise is the Raman scattering mechanism itself, which readily couples intensity fluctuations of the pumping energy into the signal to be amplified. This problem can be mitigated by using counter-propagating pumping energy, which propagates in a direction counter to or opposite the propagation direction of the signal to be amplified.

Another source of noise in Raman amplification is due to variations in amplifier gain caused by fluctuations in the polarization orientation, of the pumping energy. Although polarization-induced gain effects tend to be averaged along the length of a Raman amplifier, there are some situations in which the averaging effect does not occur because a particular polarization orientation exists throughout an appreciable portion of the amplifier length.

Although wide-bandwidth Raman amplification is possible in principle, a Raman amplifier is not very useful in a communication system if the spectral gain characteristic or spectral shape of the gain profile across frequency is highly irregular or nonuniform. As may be understood from the discussion above, the spectral gain characteristic of a Raman amplifier is determined essentially by the spectral shape and intensity of the pumping energy. Unfortunately, it is generally more costly to provide pumping energy having an appropriate polarization and sufficient intensity at the proper wavelengths that causes Raman amplification to have a reasonably flat spectral gain characteristic.

DISCLOSURE OF INVENTION

It is an object of the present invention to provide for a wide bandwidth optical amplifier having a reasonably flat spectral gain characteristic.

According to one aspect of the present invention, an optical amplifier comprises an optical waveguide having a first end and a second end, wherein a signal is received through the first end, is amplified by Raman amplification as it propagates within the optical waveguide from the first end to the second end, and is transmitted through the second end; a pumping energy source optically coupled to the optical waveguide to provide pumping energy that causes the Raman amplification to have a spectral gain characteristic; and a reflector having an input optically coupled to the second end of the optical waveguide and having an output, wherein the reflector receives the amplified signal through the input and reflects it through the output, and wherein the amplified signal is modified by the reflector according to a property that is complementary to the spectral gain characteristic of the Raman amplification.

The various features of the present invention and its preferred implementations may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Overview

Figure 1:
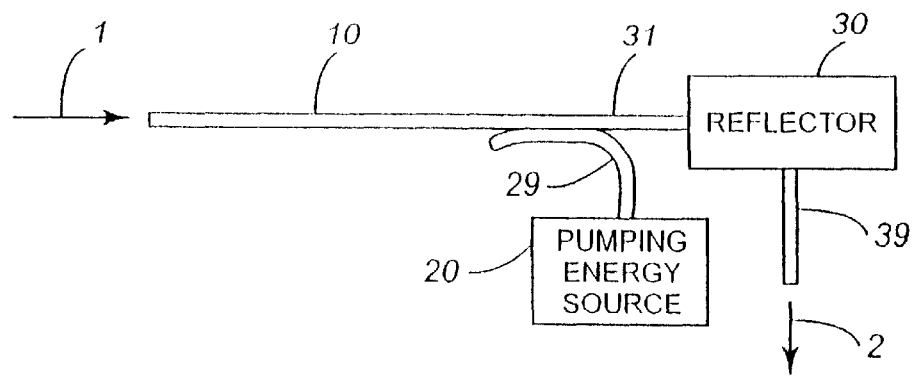
FIG. 1 is a block diagram of an optical amplifier according to the present invention.

A block diagram of an optical amplifier according to the present invention is illustrated in FIG. 1. In this implementation, an optical signal 1 to be amplified is received through a first end of optical waveguide 10. No particular type of waveguide is critical. In preferred implementations, optical waveguide 10 is a silica optical fiber according to any one of a number of conventional designs. Optical signal 1 is amplified by Raman amplification as it propagates from the first end toward a second end of optical waveguide 10.

Optical waveguide 10 receives pumping energy from pumping-energy source 20 through optical waveguide 29. This pumping energy causes the Raman amplification occurring in optical waveguide 10 to have a particular spectral gain characteristic. Various implementations of pumping-energy source 20 are discussed below.

Reflector 30 receives an amplified optical signal through input waveguide 31 coupled to the second end of optical waveguide 10, and reflects the amplified signal into output waveguide 39. Several implementations of reflector 30 are discussed below. Reflector 30 modifies the spectral characteristic of the reflected signal according to a property that is complementary to the spectral gain characteristic of the Raman amplification occurring in optical waveguide 10.

Figure 2A:
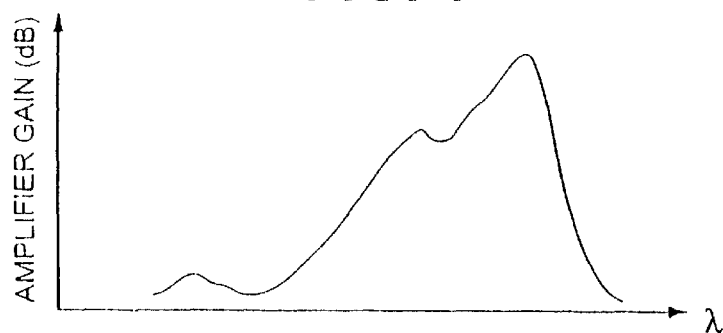
FIGS. 2A through 2C are hypothetical graphical illustrations of spectral gain characteristics of Raman amplification, reflective gain-flattening compensation, and the overall affect of amplification and compensation.
Figure 2B:
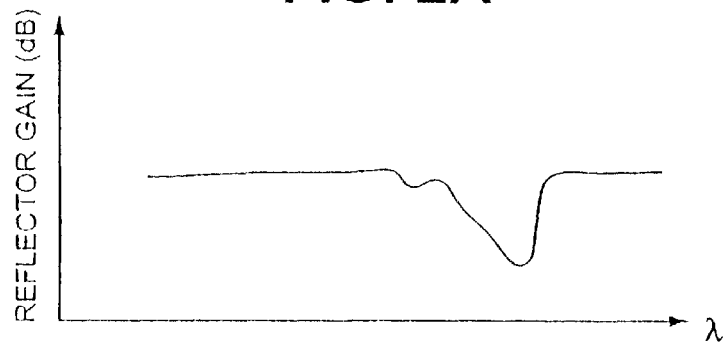
Figure 2C:
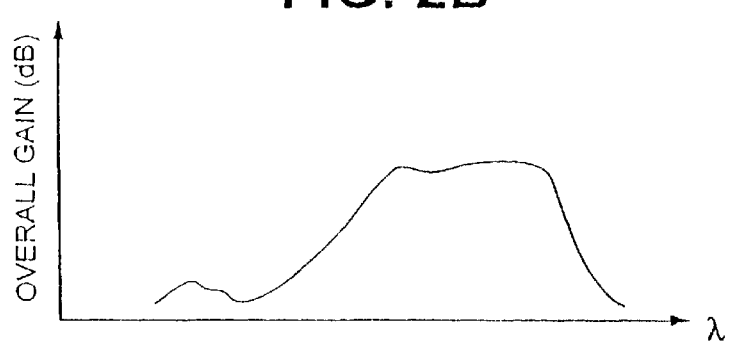

The term "complementary" refers to a general gain-flattening property that compensates at least in part for irregularities or non-uniformity in the spectral shape of the optical amplifier. The term does not mean the reflective property of reflector 30 must be a precise, exact compensation for the spectral gain characteristic of the optical amplifier. FIG. 2A illustrates a hypothetical spectral gain characteristic for a Raman amplifier. As shown in the figure, the characteristic departs significantly from an ideal flat gain profile. FIG. 2B illustrates a hypothetical complementary reflective property that provides partial compensation for the irregularities in the amplifier gain characteristic. The gain-flattening affect of the reflector is apparent from the hypothetical profile shown in FIG. 2C, which illustrates the overall gain profile of the amplifier and reflector.

B. Pumping-Energy Source

Pumping-energy source 20 may be implemented in a variety of ways. A basic implementation of pumping energy source 20 consists of one pump laser 21 directly coupled to optical fiber 29; however, in preferred implementations, components are added to stabilize the intensity and to scramble the polarization orientation of the pumping energy. Several implementations are illustrated in FIGS. 3A through 3E.

One or more pump lasers may be used in each implementation discussed below to provide pumping energy of sufficient intensity at desired wavelengths. As mentioned above, the intensity and wavelength of the pumping energy largely determine the spectral gain characteristic of Raman amplification. For example, if Raman amplification is desired for signals having wavelengths of about 1550 nm, then the pumping energy should have a wavelength of about 1470 nm. The exact wavelengths depend to some extent upon characteristics of optical fiber 10 in which the amplification is to take place. Additional information on pump laser configurations may be obtained from U.S. patent application Ser. No. 09/515,755 filed Feb. 29, 2000, which is incorporated herein by reference in its entirety.

In some applications, both counter- and co-propagating pumping energy of various wavelengths may be used advantageously. Additional information may be obtained from Rottwitt et al., "Transparent 80 km Bi-directionally Pumped Distributed Raman Amplifier With Second Order Pumping," European Conference on Optical Communications '99, Nice, France, September 1999, vol. II, pp. 144–145. U.S. provisional patent application No. 60/171,889 filed Dec. 23, 1999, both of which are incorporated herein by reference in their entirety.

1. First Implementation

Figure 3A:
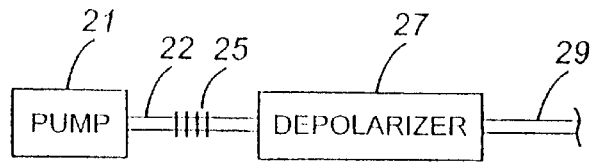
FIGS. 3A through 3E are block diagrams of pumping energy sources that may be used in an optical amplifier according to the present invention.

In the implementation shown in FIG. 3A, the output of pump laser 21 is coupled into optical fiber 22. A reflector such as fiber Bragg grating (FBG) 25 stabilizes the intensity of the pumping energy by reflecting a portion of the laser output back into the lasing cavity of pump laser 21, thereby forcing pump laser 21 to operate in a regime known as coherence collapse. The optical distance between grating 22 and pump laser 21 should not be not less than the coherence length of the laser unless the drive current is dithered or modulated at a high-frequency. Additional information about coherence collapse operation may be obtained from Tkatch et al., "Regime of Feedback Effects in 1.5 $\mu$m Distributed Feedback Lasers," J. of Lightwave Technology, 1986, vol. LT-4, pp. 1655–1661, and from U.S. Pat. Nos. 5,484,481, 5,563,732 and 5,715,263, all of which are incorporated herein by reference in their entirety. Additional information about the use of drive-current dither may be obtained from U.S. patent application Ser. No. 08/621,555 filed Mar. 25, 1996, now U.S. Pat. No. 6,058,128 issued May 2, 2000, and U.S. patent application Ser. No. 09/197,062 filed Nov. 20, 1998, all of which are incorporated herein by reference in their entirety.

Depolarizer 27 scrambles the polarization orientation of the pump laser output such that the orientation changes at a rate that is faster than the averaging time of the pumped optical amplifier. In counter-propagating implementations such as that shown in FIG. 1, the averaging time for a Raman amplifier depends to some extent on the characteristics of optical waveguide 10 but is on the order of 10 $\mu$s. In co-propagating implementations in which the pumping energy propagates within the optical waveguide in the same direction as the signal to be amplified, the averaging time also depends on the characteristics of optical waveguide 10 but is on the order of 10 ns. Counter-propagating implementations are generally preferred because of the generally better signal-to-noise ratios made possible by the longer averaging time. The depolarized and coherence-collapse stabilized pumping energy is coupled into optical waveguide 10 by optical fiber 29. Additional information pertaining to depolarized pumping energy may be obtained from U.S. patent application Ser. No. 09/559,936 filed Apr. 27, 2000, which is incorporated herein by reference in its entirety. Depolarizers that are disclosed in this '936 application may be used as depolarizers in the various implementations of the present invention that are disclosed herein.

In one arrangement, grating 22 is interposed between depolarizer 27 and pump laser 22 as shown in the figure. In an alternative arrangement, depolarizer 27 is interposed between grating 22 and pump laser 21. Some types of pump lasers are insensitive to reflected light having a polarization orientation that is orthogonal to the polarization orientation of the pump laser output. In implementations where a depolarizer is interposed between the pump laser and a reflector, care should be taken to ensure the polarization of the light reflected back into the laser cavity is such that coherence collapse is achieved.

These same considerations for intensity stabilization and depolarization are also pertinent to the other implementations discussed below.

2. Other Implementations

Figure 3B:
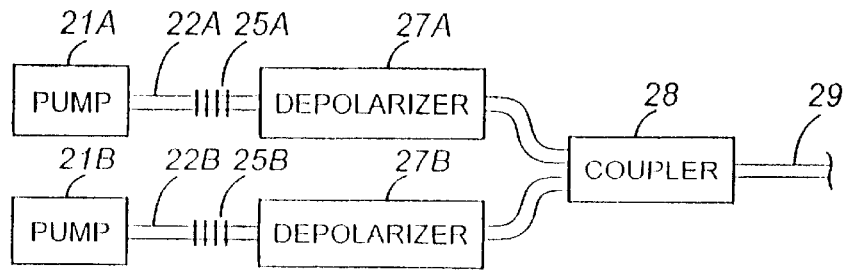
Figure 3C:
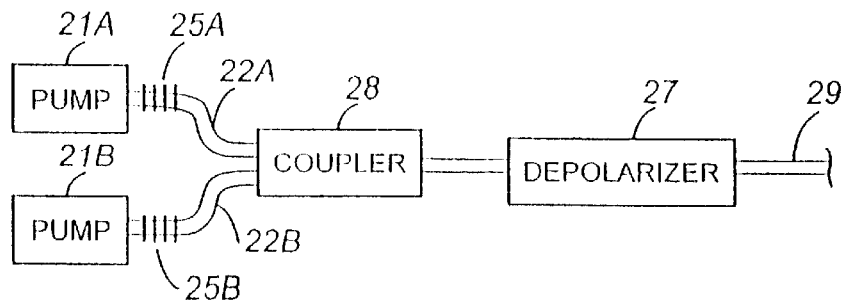

In the implementation shown in FIG. 3B, the output of pump laser 21a is intensity-stabilized and depolarized by grating 25a and depolarizer 27a, respectively, and the output of pump laser 21b is intensity-stabilized and depolarized by grating 25b and depolarizer 27b, respectively. The intensity-stabilized and depolarized outputs from the two pump lasers 21 are combined by coupler 28 and passed into optical fiber 29. Coupler 28 may also be interposed between the gratings 22a, 22b and a depolarizer 27 as shown in FIG. 3C. In either of this implementations, as well as in all other implementations discussed below, coupler 28 may be realized using either active or passive techniques. Passive techniques are generally more attractive due to cost considerations. Examples of passive techniques include bulk- and micro-optics, fused-fiber couplers, merging planar waveguides, evanescent-wave couplers, and fiber-grating couplers. More than two pump lasers 21 may be used if desired.

Figure 3D:
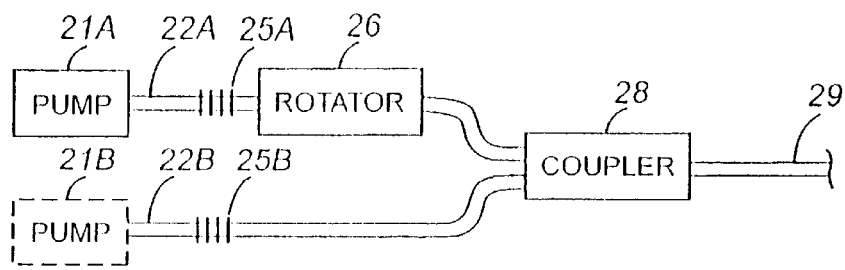

The implementation shown in FIG. 3D uses polarization rotator 26 in one of two optical fibers 22a, 22b to provide pumping energy to coupler 28 having two different polarization orientations. Two pump lasers 21a, 21b may be used to provide the pumping energy in optical fibers 22a, 22b as illustrated, or a single pump laser may be used to provide the pumping energy. A dotted line representation of pump laser 21b is used to suggest this single-laser alternative. More than two pump lasers could also be used. Additional information may be obtained from U.S. patent application Ser. No. 09/613,519 filed Jul. 10, 2000, which is incorporated herein by reference in its entirety. Preferably, the two polarization orientations that are presented to coupler 28 are orthogonal to one another. Alternatively, more than two orientations may be presented to coupler 28, in which case the relative orientations preferably are distributed more or less uniformly within a 180-degree arc. For example, if three polarization orientations are presented to coupler 28, the orientations preferably differ by angles substantially equal to sixty degrees.

Figure 3E:
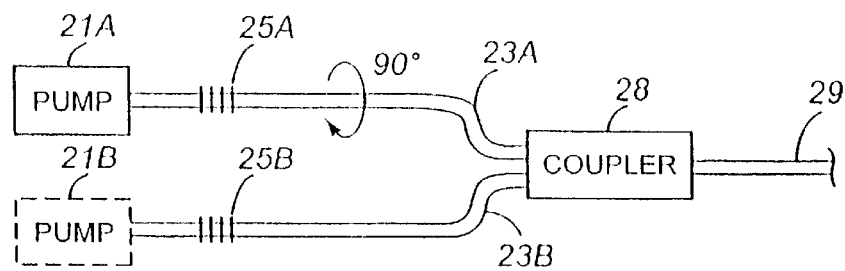

The implementation shown in FIG. 3E comprises polarization-maintaining (PM) optical fiber 23a, 23b. Different polarization orientations, similar to those discussed above in connection with the implementation shown in FIG. 3D, are achieved by twisting or rotating one or both of the two fibers about their principal axes. For example, as illustrated, two orthogonal orientations may be obtained by rotating optical fiber 23a ninety degrees. One or more pump lasers may be used to provide the pumping energy, as discussed above. Furthermore, more than two orientations may be presented to coupler 28. Preferably, the relative orientations are more or less uniformly distributed within a 180-degree arc.

C. Gain-Flattening Reflector

The spectral gain characteristic of a Raman amplifier is determined essentially by the spectral shape and intensity of the pumping energy but, unfortunately, it is generally impractical if not impossible to obtain pumping energy having sufficient intensity at the proper wavelengths that provides Raman amplification having a reasonably flat spectral gain characteristic. This problem is overcome in an optical amplifier that is implemented according to the teachings of the present invention by using reflector 30 to receive the signal as amplified in optical waveguide 10 and to reflect a modified form of this amplified signal into output waveguide 39. Reflector 30 modifies the amplified signal in a manner that is complementary to the spectral gain characteristic of the Raman amplification occurring in optical waveguide 10, thereby achieving a flatter spectral gain characteristic.

Depending upon the implementation, spectral-gain-characteristic compensation by reflection can offer a number of advantages over many traditional transmissive gain-flattening filters (GFF). Two advantages are briefly discussed below.

One advantage is improved spectral-gain flattening. Many traditional GFF are implemented by long-period gratings. Unfortunately, long-period gratings are unable to provide a spectral characteristic with dips and peaks that are sharp enough to accurately compensate the complementary peaks and dips in the spectral gain characteristic typical of practical Raman amplifiers. In contrast to this, it is easily possible to implement reflective structures that have much sharper dips and peaks.

Another advantage is chromatic-dispersion compensation. Traditional GFF cannot provide dispersion compensation. Reflector 30, however, can be implemented in a manner that provides dispersion compensation. For example, a reflective chirped fiber grating can provide dispersion compensation because the point of reflection along the length of the grating can be varied for different wavelengths.

Figure 4A:
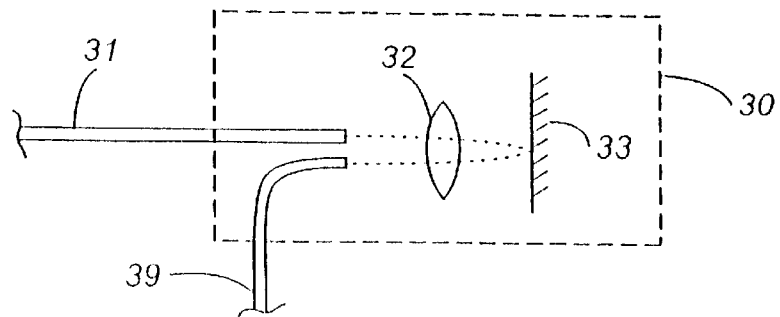
FIGS. 4A through 4D are block diagrams of reflectors that may be used in an optical amplifier according to the present invention.
Figure 4B:
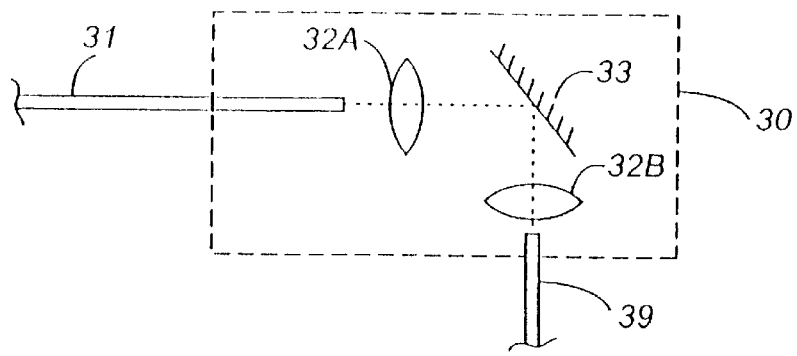

Reflector 30 may be implemented in a variety of ways. Several implementations are illustrated in FIGS. 4A through 4D. Referring to FIG. 4A, the signal amplified by optical waveguide 10 is received and conveyed by input waveguide 31 through lens 32, and then reflected by mirror 33 back through lens 32 into output waveguide 39. In another implementation shown in FIG. 4B, mirror 33 reflects the amplified signal through lens 32b into output waveguide 39. In yet another implementation, the output end of input waveguide 31 is shaped in a suitable manner to focus the reflected amplified signal onto the input end of output waveguide 39 without the use of any lenses. Collectively, the characteristics of waveguides 31, 39, lenses 32, 32b if present, and mirror 33 are complementary to the spectral gain characteristic of the amplification in optical waveguide 10.

Input waveguide 31 may be an integral part of optical waveguide 10 or it may be a distinct waveguide that is coupled to optical waveguide 10. In preferred implementations, optical waveguide 10 and input/output waveguides 31, 39 are silica fibers.

Mirror 33 may be implemented in a variety of ways including reflective gratings and dielectric mirrors.

Figure 4C:
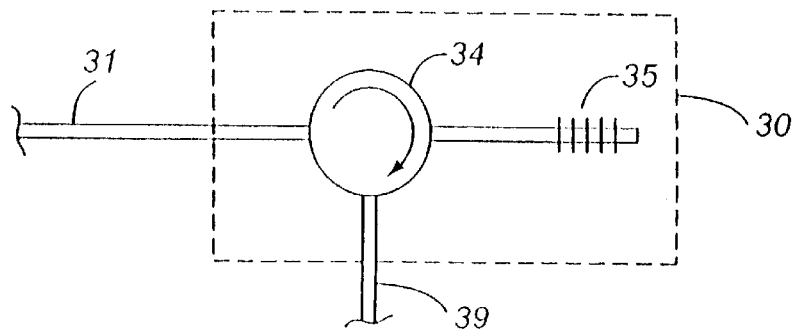

Referring to the implementation illustrated in FIG. 4C, the signal amplified by optical waveguide 10 is received and conveyed by input waveguide 31 through circulator 34 to reflector 35, which reflects the signal back through circulator 34 into output waveguide 39. Circulator 34 may be implemented in a variety of ways. No particular implementation of circulator 34 is critical. The important feature is for it to route the reflected signal into an optical path 39 that is distinct from the optical path 31 of the input amplified signal.

Figure 4D:
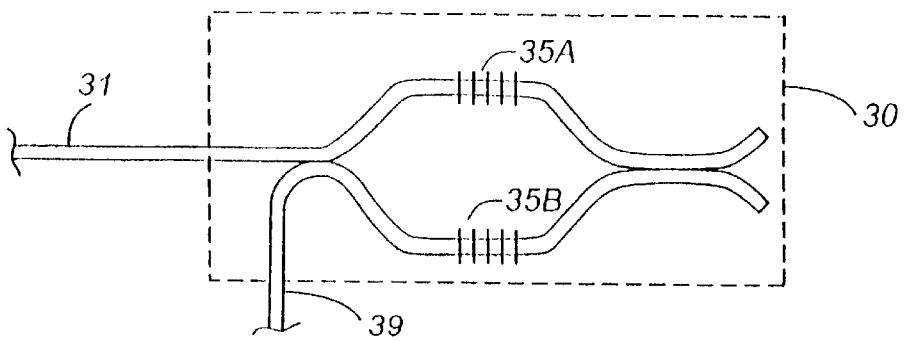

Another implementation illustrated in FIG. 4D uses reflective gratings 35a, 35b formed in each arm of a Mach-Zender fiber structure to reflect and route the amplified signal received from input fiber 31 into output fiber 39.

Preferably, in the implementations shown in FIGS. 4C and 4D, the reflective properties of fiber gratings 35, 35a, 35b provide for both gain flattening and chromatic dispersion compensation.

What is claimed is:

1. An optical amplifier comprising:

an optical waveguide having a first end and a second end, wherein a signal is received through the first end, is amplified by Raman amplification as it propagates within the optical waveguide from the first end to the second end, and is transmitted through the second end;

a pumping energy source optically coupled to the optical waveguide to provide pumping energy that causes the Raman amplification to have a spectral gain characteristic; and a reflector having an input optically coupled to the second end of the optical waveguide and having an output, wherein the reflector receives the amplified signal through the input and reflects it through the output, and wherein the amplified signal is modified by the reflector according to a property that is complementary to the spectral gain characteristic of the Raman amplification.

2. An optical amplifier according to claim 1 wherein the pumping energy has a plurality of wavelengths.

3. An optical amplifier according to claim 1 wherein the pumping energy source comprises one or more pump lasers that provide pumping energy that is substantially depolarized.

4. An optical amplifier according to claim 3 wherein the pumping energy source comprises a combiner that combines pumping energy having a plurality of polarization orientations received from the one or more pump lasers.

5. An optical amplifier according to claim 3 that comprises a depolarizer interposed between the optical waveguide and the one or more pump lasers.

6. An optical amplifier according to claim 3 that comprises a polarization rotator, and wherein at least part of the pumping energy from one pump laser passes through the polarization rotator.

7. An optical amplifier according to claim 3 wherein the one or more pump lasers operate in a coherence collapse mode.

8. An optical amplifier according to claim 4 wherein the one or more pump lasers operate in a coherence collapse mode.

9. An optical amplifier according to claim 5 wherein the one or more pump lasers operate in a coherence collapse mode.

10. An optical amplifier according to claim 6 wherein the one or more pump lasers operate in a coherence collapse mode.

11. An optical amplifier according to claim 1 wherein the reflector comprises an optical filter with transmissive properties that cause, at least in part, the property of the reflector that is complementary to the spectral gain characteristic of the Raman amplification.

12. An optical amplifier according to claim 1 wherein the reflector comprises a multilayer dielectric material.

13. An optical amplifier according to claim 1 wherein the reflector comprises a reflective fiber grating and an optical circulator.

14. An optical amplifier according to claim 1 wherein the reflector comprises a fused coupler with a respective reflective grating in each output arm of the coupler.

15. An optical amplifier according to claim 1 wherein the reflector comprises one or more reflective gratings.

* * * * *